United States Patent
Rider et al.

(10) Patent No.: US 6,625,027 B2
(45) Date of Patent: Sep. 23, 2003

(54) METHOD FOR INCREASING THE DIELECTRIC STRENGTH OF ISOLATED BASE INTEGRATED CIRCUITS USED WITH VARIABLE FREQUENCY DRIVES

(75) Inventors: Jerald Ray Rider, Catoosa, OK (US); Vester Ray Raynor, Claremore, OK (US)

(73) Assignee: Baker Hughes Incorporated, Houston, TX (US)

( * ) Notice: Subject to any disclaimer, the term of this patent is extended or adjusted under 35 U.S.C. 154(b) by 0 days.

(21) Appl. No.: 09/999,106

(22) Filed: Oct. 31, 2001

(65) Prior Publication Data

US 2003/0081384 A1 May 1, 2003

(51) Int. Cl.$^7$ .................................................. H05K 7/20
(52) U.S. Cl. ...................... 361/706; 174/258; 361/707; 361/708; 361/719; 361/713; 429/901
(58) Field of Search .................. 174/252, 16.3, 174/258, 260; 257/706–707, 709, 712–713, 717; 165/80.2, 185; 361/688, 690, 704–710, 767, 712–713, 717–722; 428/901

(56) References Cited

U.S. PATENT DOCUMENTS

| | | | |
|---|---|---|---|
| 3,792,525 A | 2/1974 | McKinnon et al. | 29/588 |
| 4,648,008 A * | 3/1987 | Neyroud et al. | 361/707 |
| 5,055,967 A * | 10/1991 | Sukonnik et al. | 361/707 |
| 5,198,693 A | 3/1993 | Imken et al. | 257/720 |
| 5,272,375 A | 12/1993 | Belopolsky | 257/717 |
| 5,544,412 A * | 8/1996 | Romero et al. | 361/767 |
| 5,606,487 A * | 2/1997 | Yasukawa et al. | 361/707 |
| 5,744,863 A | 4/1998 | Culnane et al. | 257/712 |
| 6,225,571 B1 * | 5/2001 | Bream et al. | 174/252 |

* cited by examiner

Primary Examiner—Gregory Thompson

(57) ABSTRACT

A heat sink structure increasing the dielectric strength of isolation for power integrated circuits is formed from a common layer on which laterally spaced isolated layers for each individual integrated circuit are mounted. At least the isolated layers are formed of anodized aluminum coated with aluminum oxide on exterior surfaces. The aluminum and aluminum oxide of the isolated layers provide good thermal conduction for heat dissipation while the electric isolation from the common electric potential of the common layer is improved, at least in part, by increasing the distance between the integrated circuits and the common layer. The heat sink structure may be mounted within a weatherproof enclosure with one externally exposed surface for heat dissipation.

20 Claims, 2 Drawing Sheets

METHOD FOR INCREASING THE DIELECTRIC STRENGTH OF ISOLATED BASE INTEGRATED CIRCUITS USED WITH VARIABLE FREQUENCY DRIVES

TECHNICAL FIELD OF THE INVENTION

The present invention is directed, in general, to heat dissipation for power electronics switching voltages above normal electrical isolation ratings and, more specifically, to providing a common heat sink for multiple power electronics integrated circuit devices connected in series and switching voltages for driving artificial lift equipment within a borehole.

BACKGROUND OF THE INVENTION

Many power electronics semiconductor integrated circuit devices are currently employed in connection with power and control systems for production within a borehole. In particular, integrated circuit devices may be employed to step-up (i.e., increase) the voltage of power produced for transmission into the borehole from a power source such as a generator or a connection to a local fixed power grid. Power electronics integrated circuit devices are typically connected between the power source and the filter(s) and drive employed to generate the specific voltage waveforms transmitted into the borehole to power artificial lift equipment within the borehole.

Heat dissipation requirements of power electronics integrated circuit devices generally require that the integrated circuit packages be mounted on a heat sink (or, equivalently, a "heat spreader"), electrically isolated from the normally-metallic heat sink material by an interposed dielectric material. The rated electric isolation for an integrated circuit device capable of switching voltages up to 1200 volts is usually about 2500 volts.

When multiple integrated circuit devices are mounted to one or more heat sinks at a common voltage potential, generally no problems arise as long as the system operates only at voltages within the electric isolation ratings. However, when the integrated circuit devices are connected in series to increase the system voltage for use with "medium" voltage drives operating at 4–6 kilovolts (kV), the conventional base isolation becomes inadequate.

Moreover, in designing electrical power systems for use with production from a borehole, various considerations not germane to other applications of electrical power systems must be taken into account. Climatic conditions, in particular, must be considered since the equipment must be located proximate to the borehole, typically at an outdoor location subject to inclement weather conditions and, in the case of subsea wells, on a production platform. While the power electronics and drive may easily be contained in a weatherproof enclosure, the heat sinks employed for the power electronics preferably include at least one externally exposed surface for cooling purposes.

There is, therefore, a need in the art for improved design of heat sinks to be employed in connection with power electronics for medium voltage drives.

SUMMARY OF THE INVENTION

To address the above-discussed deficiencies of the prior art, it is a primary object of the present invention to provide, for use in an electric power system for borehole production, a heat sink structure increasing the dielectric, strength of isolation for power integrated circuits. The heat sink structure is formed from a common layer on which laterally spaced isolated layers for each individual integrated circuit are mounted. At least the isolated layers are formed of anodized aluminum coated with aluminum, oxide on exterior surfaces. The aluminum and aluminum oxide of the isolated layers provide good thermal conduction for heat dissipation while the electric isolation from the common electric potential of the common layer is improved, at least in part, by increasing the distance between the integrated circuits and the common layer. The heat sink structure may be mounted within a weatherproof enclosure with one externally exposed surface for heat dissipation.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives, thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
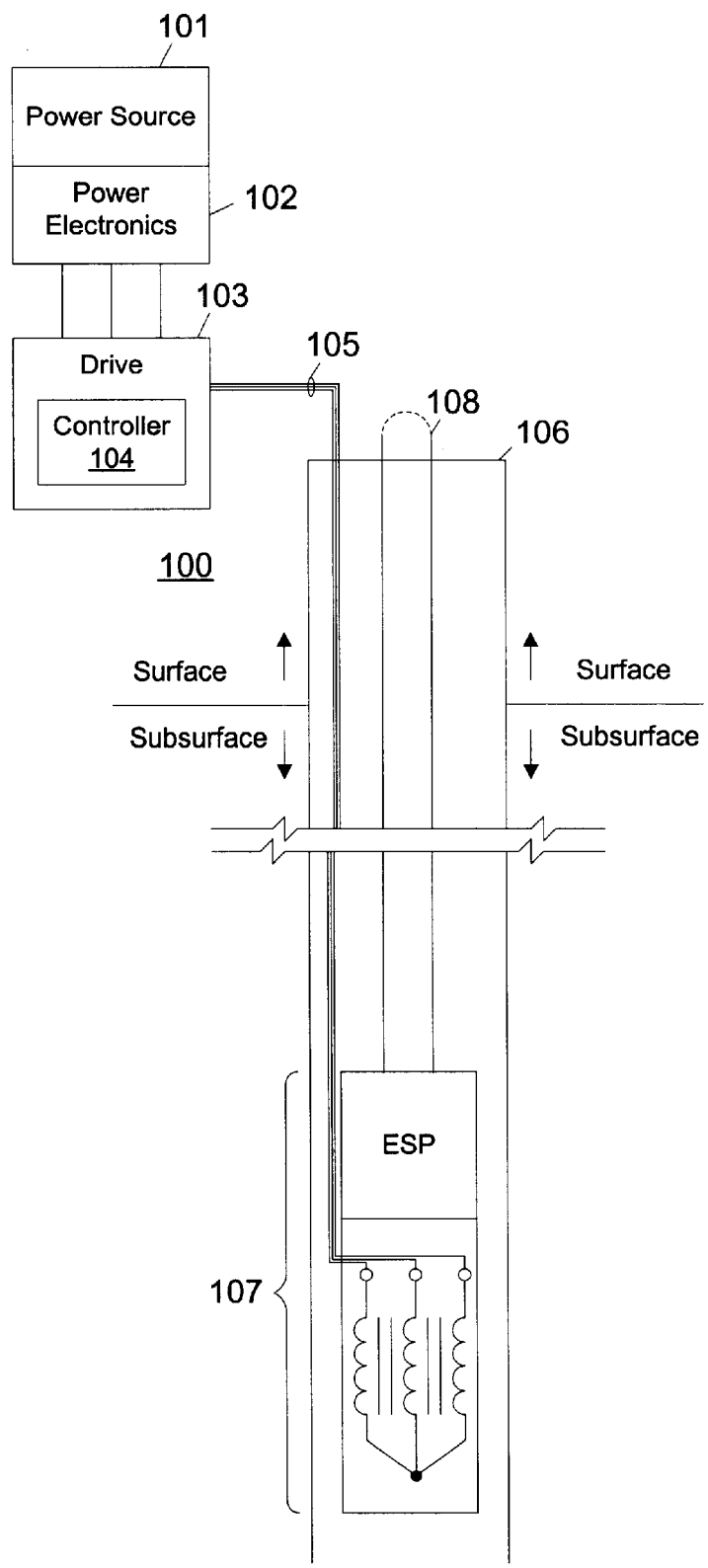
FIG. 1 depicts a borehole production system employing improved electrical isolation and heat dissipation for power electronics relating to a drive transmitting power into the borehole according to one embodiment of the present invention.
Figure 2:
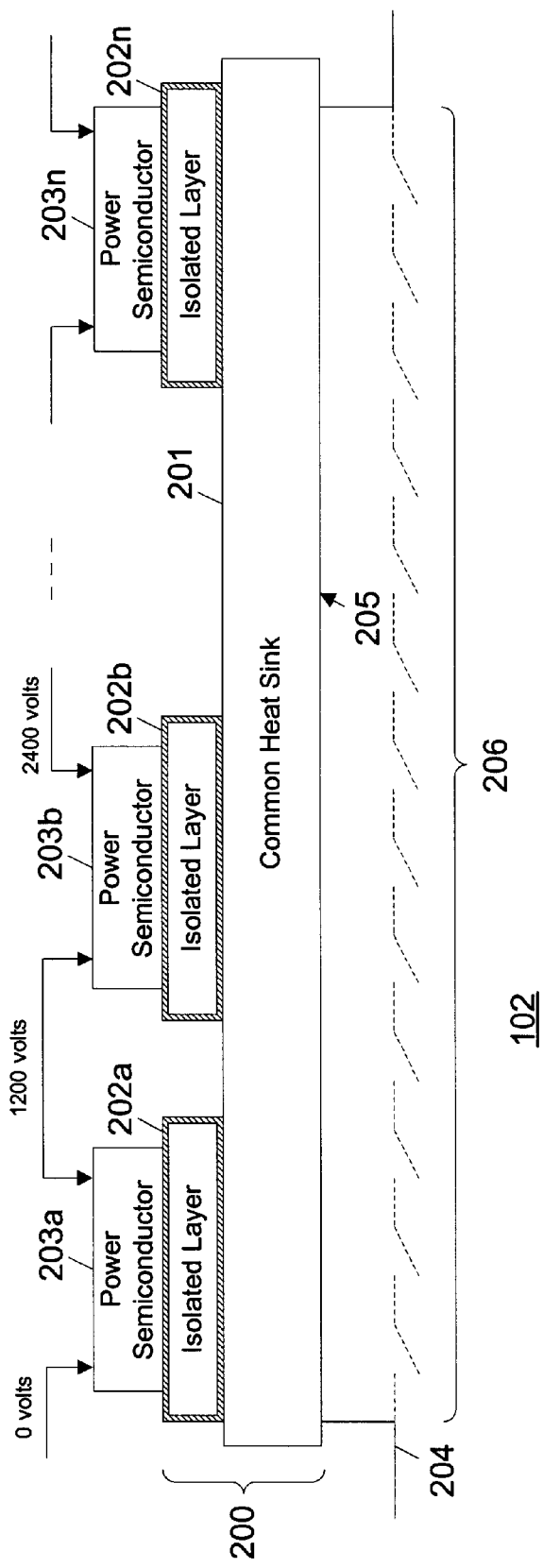
FIG. 2 depicts in greater detail improved electrical isolation and heat dissipation for power electronics according to one embodiment of the present invention.

FIGS. 1 and 2, discussed below, and the various embodiments used to describe the principles of the present invention in this patent document are by way of illustration only and should not be construed in any way to, limit the scope of the invention. Those skilled in the art will understand that the principles of the present invention may be implemented in any suitably arranged device.

FIG. 1 depicts a borehole production system employing improved electrical isolation and heat dissipation for power electronics relating to a drive transmitting power into the borehole according to one embodiment of the present invention. Production system 100 includes a power source 101, such as a generator or a connection to the local alternating current (A/C) power grid, coupled by power electronics 102 to an electrical drive 103, which in the exemplary embodiment is preferably a variable frequency drive (VFD) capable of operating in one or more of an n-step variable voltage inverter (VVI) mode and a pulse width modulation (PWM) mode.

Drive 103, under operational control of an associated controller 104, generates electrical power (typically three phase power) which is transmitted over power cable(s) 105 into a borehole 106. The transmitted power is received within the borehole 106 by artificial lift equipment 107 coupled to production tubing 108 and lowered within the borehole 106 in accordance with the known art. Those skilled in the art will recognize that artificial lift equipment 107, which in the exemplary embodiment preferably, comprises an induction motor and a submersible centrifugal pump forming an electrical submersible pump (ESP) system, operates in response to the received power to assist in production of oil, gas, and other hydrocarbon fluids from the borehole 106. A detailed description of the construction and operation of a suitable electrical submersible pump system is contained in U.S. Pat. No. 6,167,965, issued to the assignee of the present invention.

Those skilled in the art will recognize that the complete construction and operation of a borehole production system is not depicted or described herein. Instead, only so much of the borehole production system as is unique to the present invention or necessary for an understanding of the present invention is shown and described. However, borehole production system 100 includes, embodied chiefly within power electronics 102, improved electrical isolation and heat dissipation for power electronics according to the present invention as described in greater detail below.

FIG. 2 depicts in greater detail improved electrical isolation and heat dissipation for power electronics according to one embodiment of the present invention. A heat sink or spreader structure 200 according to the present invention is built is electrically isolated layers. Heat sink 200 includes a common heat sink layer 201 (which may be electrically connected to ground) and n isolated layers 202a–202n for each of n power electronics integrated circuit devices 203a–203n employed within power electronics 102 of the borehole production system 100. Integrated circuit devices 203a–203n are connected in series in the exemplary embodiment and switch voltages of 4–6 KV.

Isolated heat sink layers 202a–202n are electrically isolated from each other as well as from common heat sink layer 201 and the integrated circuit devices 203a–203n mounted thereon. Each isolated heat sink layer 202a–202n adds to the dielectric strength of the integrated circuit devices 202a–202n mounted thereon, as well as to the overall dielectric strength of the system.

The specific method of insulating isolated heat sink layers 202a–202n is not critical, although the dielectric employed should be both a good thermal conductor and a good electrical insulator. In the exemplary embodiment, aluminum is employed for both common heat sink layer 201 and isolated heat sink layers 202a–202n, and at least isolated heat sink layers 202a–202n are anodized to form a layer of aluminum oxide on the exterior surfaces of isolated heat sink layers 202a–202n. Common heat sink layer 201 may optionally also be anodized. Aluminum oxide is a good electrical insulator while providing a good conductor for heat transfer. Where mounted screws are claw employed to secure packaged integrated circuit devices 203a–203n to the isolated heat sink layers 202a–202n, screw holes within isolated heat sink layers 202a–202n are preferably drilled and threaded prior to anodizing the isolated layers 202a–202n, so that the interior of the screw holes are also coated with insulation.

The dielectric strength of heat sink structure is increased, at least in part, by the increased distance between integrated circuit devices 203a–203n and a common potential (common layer 201) provided by isolated layers 202a–202n. A dielectric layer, only, having an equivalent thickness to isolated.layers 202a–202n is unlikely to have acceptable thermal conduction properties between integrated circuit devices 203a–203n and common layer 201. Use of a heat sink material coated on opposing sides with a dielectric increases the thermal conductivity of the isolated layers 202a–202n while providing acceptable dielectric properties, including distance from the common potential.

Many suitable variations of the basic structure shown for heat sink structure 200 may be utilized. Each isolated layer 202a–202n need not be only a single layer as depicted, but may be formed of a number of stacked layers each coated on all sides by an insulating material, or otherwise separated by insulating material. Moreover, the number of stacked layers with intervening dielectric material forming each isolated layer 202a–202n need not be uniform, with each isolated layer 202a–202n employing a number of levels within the stack related to the voltage developed by the integrated circuit device 203a–203n mounted on the corresponding isolated layer 202a–202n.

Additionally, while lateral isolation of isolated layers 202a–202n is preferred, a staggered "stair-step" configuration of layers may be alternatively employed, in which, for example, isolated layer 202a would extend on common layer 201 beneath all of integrated circuit devices 203a–203n as well as isolated layers 202b–202n; isolated layer 202b would extend, on isolated layer 202a, beneath all of integrated circuit devices 203b–203n and isolated layer 202n; and isolated layer 202n would extend, on the surface of isolated layer 202b or an intervening isolated layer, beneath only integrated circuit device 203n. Such a staggered configuration of layers would permit different levels of electric potential to exist within the conductive body or core of each "level" or isolated layer, such that the highest voltage developed is insulated by multiple levels (each at different electric potentials) from a common or ground potential.

For use in connection with borehole production, heat sink structure 200 may be mounted within a weatherproof cabinet 204 with an externally exposed surface 205 for heat dissipation. The externally exposed surface 205, which in the exemplary embodiment is preferably at least a portion of the major surface of common layer 201 opposite the surface on which isolated layers 202a–202n and integrated circuit devices 203a–203n are mounted, may be either directly exposed or covered by optional vented cover 206. Mounted of heat sink structure 200 within cabinet 204 with surface 205 externally exposed should, however, preferably be dust-tight and sealed against moisture.

The present invention improves the dielectric strength of isolated base semiconductor integrated circuit devices employed in connection with variable frequency drives for borehole production and connected in series to switch voltages in excess of the electric isolation rating for conventional mounting of such devices on a heat sink. Good thermal conduction for the heat sink is maintained while increasing the distance of separation between the integrated circuit devices and a common electric potential such as a ground potential.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A power electronics heat sink structure, comprising:
   a common thermally conductive layer;
   a plurality of isolated layers each mounted over a different region of a surface of the common layer and each comprising a first, thermally conductive material; and
   a second, dielectric material different from the first material over at least a surface of each isolated layer nearest the common layer and an opposite surface of each isolated layer over which a power electronics integrated circuit device is to be mounted.

2. The power electronics heat sink structure according to claim 1, wherein the isolated layers are laterally isolated from each other.

3. A power electronics heat sink structure, comprising:
   a common thermally conductive layer; and
   a plurality of isolated thermally conductive layers each mounted over a surface of the common layer, each isolated layer including a dielectric material over at least a surface nearest the common layer and an opposite surface over which a power electronics integrated circuit device is to be mounted,
   wherein the common layer comprises aluminum and the isolated layers comprise anodized aluminum coated with aluminum oxide on exterior surfaces.

4. The power electronics heat sink structure according to claim 1, wherein the isolated layers increase the dielectric strength of electrical isolation for power electronics integrated circuit devices mounted thereon at least in part by increasing a distance between the respective power electronics integrated circuit device and a common electric potential.

5. A power electronics heat sink structure, comprising:
   a common thermally conductive layer; and
   a plurality of isolated thermally conductive layers each mounted over a surface of the common layer, each isolated layer including a dielectric material over at least a surface nearest the common layer and an opposite surface over which a power electronics integrated circuit device is to be mounted,
   wherein the dielectric material comprises a dielectric coating over exterior surfaces of the isolated layers.

6. The power electronics heat sink structure according to claim 1, wherein the common layer is adapted for mounting within an enclosure with at least a portion of one surface partially exposed for heat dissipation.

7. The power electronics heat sink structure according to claim 6, wherein the at least partially exposed surface of the common layer is a surface opposite the surface over which the plurality of isolated layers are mounted.

8. A power system for borehole production, comprising:
   an electric drive including connections for coupling to a power source and producing electric power for artificial lift equipment within a borehole;
   a plurality of power electronics integrated circuits coupled between the power source and the electric drive; and
   a heat sink structure on which the power electronics integrated circuits are mounted, the heat sink structure comprising:
      a common thermally conductive layer;
      a plurality of isolated layers each mounted over a different region of a surface of the common layer and each comprising a first, thermally conductive material; and
      a second, dielectric material different from the first material over at least a surface of each isolated layer nearest the common layer and an opposite surface of each isolated layer over which a power electronics integrated circuit device is to be mounted.

9. The power system according to claim 8, wherein the isolated layers are laterally isolated from each other.

10. A power system, comprising:
    an electric drive including connections for coupling to a power source and producing electric power for artificial lift equipment within a borehole;
    a plurality of power electronics integrated circuits coupled between the power source and the electric drive; and
    a heat sink structure on which the power electronics integrated circuits are mounted, the heat sink structure comprising:
       a common thermally conductive layer; and
       a plurality of isolated thermally conductive layers each mounted over a surface of the common layer, each isolated layer including a dielectric material over at least a surface nearest the common layer and an opposite surface over which one of the power electronics integrated circuit device is mounted,
    wherein the common layer comprises aluminum and the isolated layers comprise anodized aluminum coated with aluminum oxide on exterior surfaces.

11. The power system according to claim 8, wherein the isolated layers increase the dielectric strength of electrical isolation for the power electronics integrated circuit devices mounted thereon at least in part by increasing a distance between the power electronics integrated circuit device and a common electric potential.

12. A power system, comprising:
    an electric drive including connections for coupling to a power source and producing electric power for artificial lift equipment within a borehole;
    a plurality of power electronics integrated circuits coupled between the power source and the electric drive; and
    a heat sink structure on which the power electronics integrated circuits are mounted, the heat sink structure comprising:
       a common thermally conductive layer; and
       a plurality of isolated thermally conductive layers each mounted over a surface of the common layer, each isolated layer including a dielectric material over at least a surface nearest the common layer and an opposite surface over which one of the power electronics integrated circuit device is mounted,
    wherein the dielectric material comprises a dielectric coating over exterior surfaces of the isolated layers.

13. The power system according to claim 8, wherein the common layer is adapted for mounting within an enclosure with at least a portion of one surface partially exposed for heat dissipation.

14. The power system according to claim 7, wherein the at least partially exposed surface of the common layer is a surface opposite the surface over which the plurality of isolated layers are mounted.

15. A method of increasing the dielectric strength of electrical isolation for integrated circuits utilized with medium voltage electric drives powering borehole production equipment, comprising:

provinding a common thermally conductive layer; and mounting each of a plurality of isolated layers over a different region of a surface of the common layer, each isolated layer including a first, thermally conductive material and a second, dielectric material different from the first material over at least a surface of the first material nearest the common layer and an opposite surface of the first material; and mounting each of a plurality of power electronics integrated circuit devices on the opposite surface of one of the plurality of isolated layers.

16. The method according to claim 15, further comprising:

laterally isolating the isolated layers from each other.

17. A method of increasing the dielectric strength of electrical isolation for integrated circuits utilized with medium voltage electric drives powering borehole production equipment, comprising:

providing a common thermally conductive layer; and mounting each of a plurality of isolated thermally conductive layers over a surface of the common layer, each isolated layer including a dielectric material over at least a surface nearest the common layer and an opposite surface; and mounting each of a plurality of power electronics integrated circuit devices on the opposite surface of one of the plurality of isolated layers, wherein the common layer comprises aluminum and the isolated layers comprise anodized aluminum coated with aluminum oxide on exterior surfaces.

18. The method according to claim 15, wherein the isolated layers increase the dielectric strength of electrical isolation for the power electronics integrated circuit devices mounted thereon at least in part by increasing a distance between the power electronics integrated circuit device and a common electric potential.

19. A method of increasing the dielectric strength of electrical isolation for integrated circuits utilized with medium voltage electric drives powering borehole production equipment, comprising:

providing a common thermally conductive layer; and mounting each of a plurality of isolated thermally conductive layers over a surface of the common layer, each isolated layer including a dielectric material over at least a surface nearest the common layer and an opposite surface; and mounting each of a plurality of power electronics integrated circuit devices on the opposite surface of one of the plurality of isolated layers, wherein the dielectric material comprises a dielectric coating over exterior surfaces of the isolated layers.

20. A method of increasing the dielectric strength of electrical isolation for integrated circuits utilized with medium voltage electric drives powering borehole production equipment, comprising:

providing a common thermally conductive layer; and mounting each of a plurality of isolated thermally conductive layers over a surface of the common layer, each isolated layer including a dielectric material over at least a surface nearest the common layer and an opposite surface;

mounting each of a plurality of power electronics integrated circuit devices on the opposite surface of one of the plurality of isolated layers; and mounting the common layer within an enclosure with at least a portion of one surface partially exposed for heat dissipation, wherein the at least partially exposed surface of the common layer is a surface opposite the surface over which the plurality of isolated layers are mounted.

* * * * *